United States Patent [19]
Ford

[11] Patent Number: 5,500,598
[45] Date of Patent: Mar. 19, 1996

[54] APPARATUS FOR TESTING ELECTRICAL COMPONENTS WHICH HAVE WINDINGS

[75] Inventor: John S. Ford, Oxon, United Kingdom

[73] Assignee: Voltech Instruments Limited, Oxon, United Kingdom

[21] Appl. No.: 256,947

[22] PCT Filed: Nov. 13, 1992

[86] PCT No.: PCT/GB92/02104

§ 371 Date: Jul. 27, 1994

§ 102(e) Date: Jul. 27, 1994

[87] PCT Pub. No.: WO93/10465

PCT Pub. Date: May 27, 1993

[30] Foreign Application Priority Data

Nov. 16, 1991 [GB] United Kingdom .................... 9124428

[51] Int. Cl.$^6$ ..................................... G01R 31/06
[52] U.S. Cl. ..................... 324/547; 324/73.1; 324/546; 324/726; 340/646
[58] Field of Search ..................... 324/545, 546, 324/547, 551, 650, 726, 772, 73.1; 364/481, 579; 361/35; 340/646

[56] References Cited

U.S. PATENT DOCUMENTS

| | | | |
|---|---|---|---|
| 3,732,489 | 5/1973 | Nelson et al. ................. | 324/726 |
| 3,932,811 | 1/1976 | Branch ........................... | 324/772 |
| 4,525,789 | 6/1985 | Kemper et al. ................ | 364/481 |

FOREIGN PATENT DOCUMENTS

| | | |
|---|---|---|
| 452665 | 12/1987 | Sweden . |
| 723462 | 3/1980 | U.S.S.R. . |
| 794565 | 1/1981 | U.S.S.R. . |

*Primary Examiner*—Kenneth A. Wieder
*Assistant Examiner*—Diep Do
*Attorney, Agent, or Firm*—Webb Ziesenheim; Bruening Logsdon; Orkin & Hanson

[57] ABSTRACT

The apparatus comprises a plurality of connectors (9, 10, 11, 12 . . .) for connecting to the component to be tested (e.g. a transformer), a signal generator (19), a measuring system (23) and control means (22) which is arranged to control which of the connectors (9, 10, 11, 12 . . .) are connected to the signal generator (19) and the measuring system {23} and arranged to control the function of the signal generator (19) and the measuring system (23) so that the same signal generator (19) and measuring system (23) can be used to carry out a variety of different tests on the component, the signal generator (19) also being arranged to provide a synchronising signal (28) to the measuring system (23) so that the phase relationship between measurements at different times can be calculated by comparing the phase relationships of those measurements with the synchronising signal (28).

14 Claims, 10 Drawing Sheets

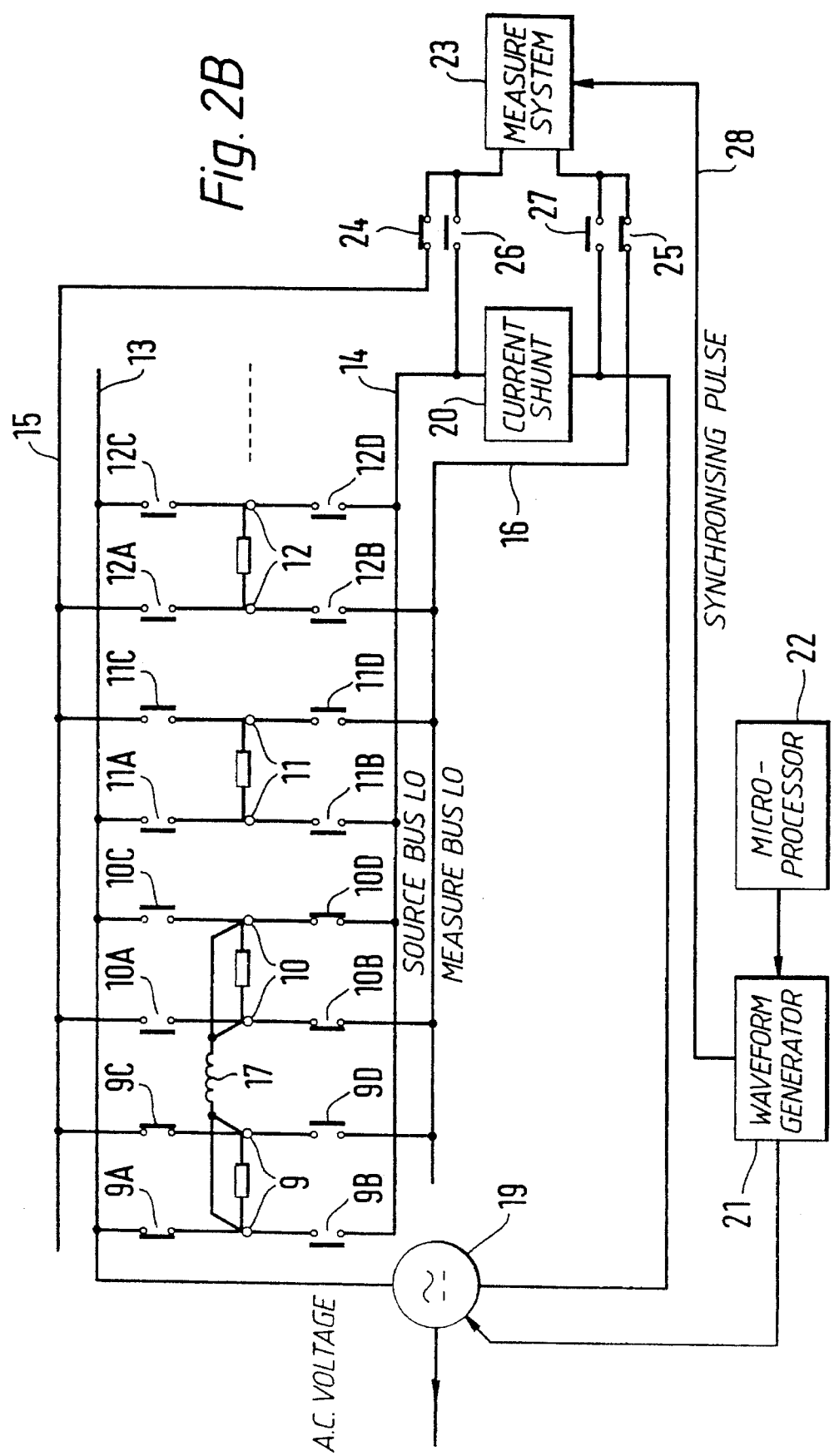

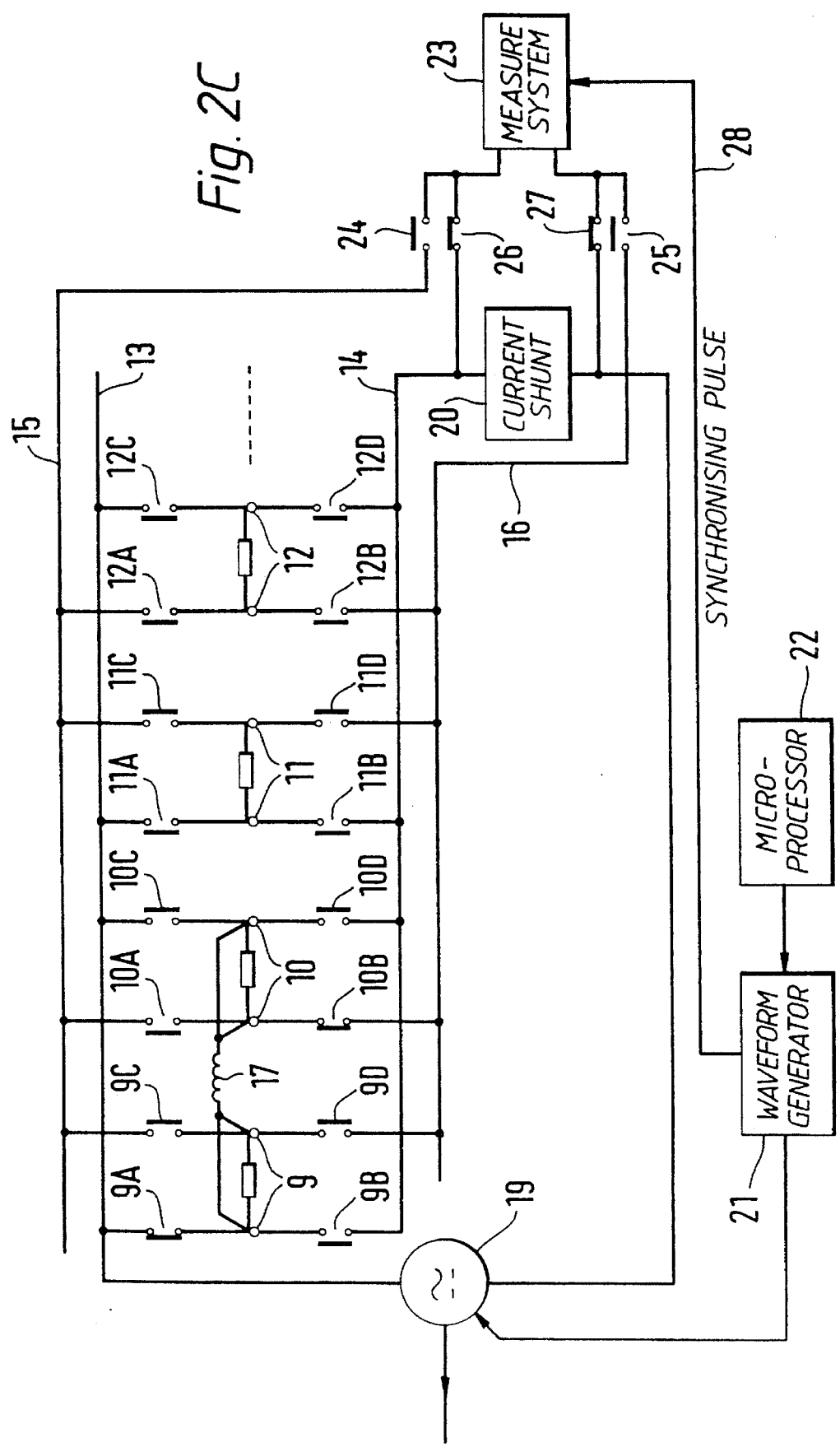

APPARATUS FOR TESTING ELECTRICAL COMPONENTS WHICH HAVE WINDINGS

TECHNICAL FIELD

This invention relates to apparatus for testing wound components such as a transformer.

BACKGROUND ART

In order to test thoroughly a wound component such as a transformer, it is necessary to measure a variety of parameters such as: the winding resistance (of both the primary and secondary windings), the turns ratios, the winding inductance or magnetising current and the interwinding capacitance. It is also usual to test the insulation at both high and low voltage levels, These parameters are conventionally measured by sequentially connecting the transformer to a series of separate pieces of test equipment each of which is dedicated to testing one particular parameter. Such testing thus requires several, usually expensive and relatively large pieces of equipment, to test fully the transformer. At each stage, the transformer has to be electrically connected to the relevant test equipment, the test carried out, then electrically disconnected and moved on to the next piece of test equipment and the operation repeated for each test to be carried out. This procedure is time consuming and error prone as wires may be wrongly connected, measuring equipment mis-read, results incorrectly recorded etc.

Apparatus has also been provided for automatically and sequentially connecting a transformer to a plurality of separate pieces of test equipment using a matrix of relays under the control of a computer. This automates the connecting and disconnecting of the various pieces of test equipment but a separate piece of equipment is still required to carry out each test. This means that a benchful of equipment is still required to test a component which itself may be relatively small, e.g. with maximum dimensions in the order of 10–20 cms. The lengthy leads required to connect the different pieces of equipment also makes some measurements difficult, e.g. high frequency tests with leads over 2 m in length. This form of test apparatus is also still relatively slow, e.g. taking 30 seconds or more to test a transformer fully, and is of necessity relatively expensive.

This invention aims to provide test apparatus which is much more compact than such known arrangements yet is able to carry out all the tests required quickly and accurately.

DISCLOSURE OF INVENTION

Thus, according to the present invention, there is provided apparatus for testing a wound component comprising a plurality of connectors for connecting to the component to be tested; signal generating means selectively connectable to one or more of the connectors for applying a variety of different test signals to the component to be tested; measuring means selectively connectable to measure a variety of different outputs from the component to be tested; and control means for controlling which of the connectors are connected to the signal generating means and the connection of the measuring means to one or more outputs of the component being tested, for controlling the signals applied by the signal generating means to the selected connectors and for controlling the function of the measuring means, whereby the same signal generating means and measuring means can be used to carry out a variety of different forms of test on the component to be tested, the signal generating means being connected to the measuring means and being arranged to provide a synchronising signal thereto and the measuring means being arranged to calculate the phase relationship between signals measured at different times by comparing the phase relationships of those signals with the synchronising signal. Preferred features of the invention will be apparent from the following description and from the subsidiary claims of the specification.

BRIEF DESCRIPTION OF DRAWINGS

The invention will now be further described, merely by way of example, with reference to the accompanying drawings, in which:

FIGS. 2(A) to 2(C) are diagrams of apparatus according to a preferred form of the invention showing different connections used to carry out different tests;

BEST MODE OF CARRYING OUT THE INVENTION

Figure 1A:
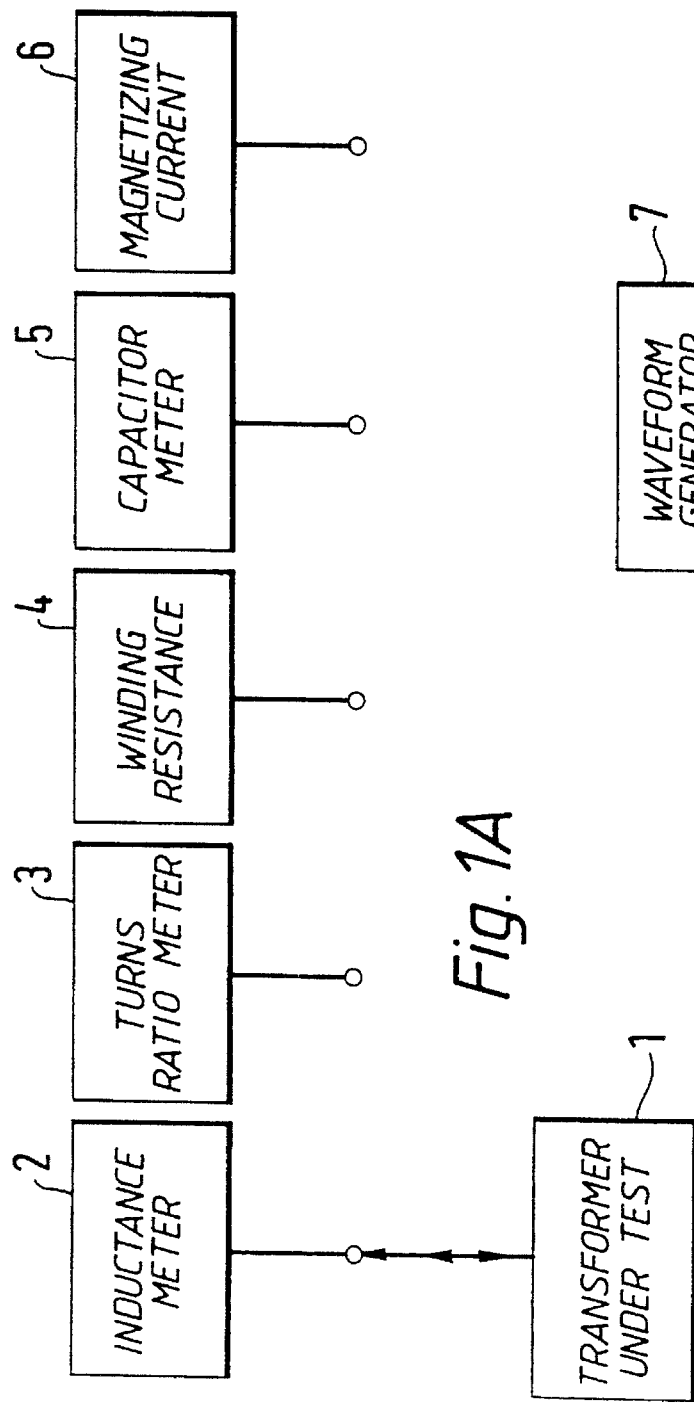
FIG. 1(A) is a schematic diagram of a conventional arrangement for testing a transformer and FIG. 1(B) is a schematic diagram of a corresponding arrangement using apparatus according to the invention.

A conventional method of testing a transformer is illustrated by FIG. 1A. The transformer 1 is tested by means of a stage-by-stage process in which it is sequentially connected to a plurality of separate pieces of test equipment, for instance, an inductance meter 2, a turns ratio meter 3, a winding resistance meter 4, a capacitance meter 5 and a magnetising current meter 6 as shown in FIG. 1A. Such conventional test equipment measures the respective parameter using well-known analogue techniques.

A typical test procedure using equipment such as that shown in FIG. 1A may comprise the following checks:

(1) Continuity and resistance checks: each winding has its resistance measured by means of an ohmmeter.

(2) Magnetising Current: current through the primary winding is measured with the secondary winding open-circuit, i.e. off-load. This is usually performed using a rectified moving-coil ammeter or a digital ammeter.

(3) Turns-ratio: measured off-load winding voltages are measured and turns ratio calculated.

(4) Phasing: measured off-load using a dual channel oscilloscope.

(5) Inductance: measured using an inductance bridge, either manually or automatically balanced.

(6) Interwinding Capacitance: measured using a bridge in capacitance mode.

(7) Insulation Test: usually done using a 500 v dc power supply connected between the windings and the transformer cover. Leakage current is usually indicated by an ammeter inserted in one of the supply leads.

(8) Flash Testing: usually carried out at 5 kv AC/DC with leakage current measured as described above.

Figure 1B:
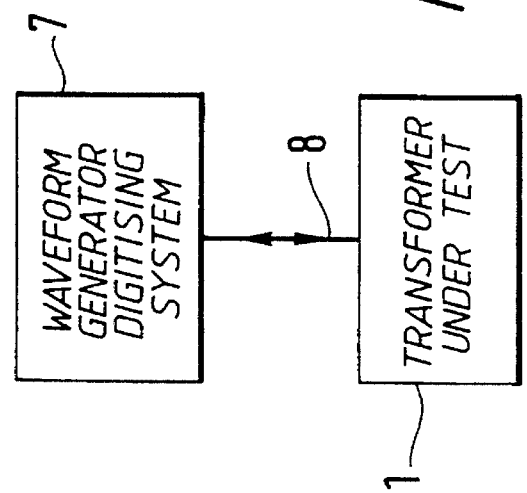

FIG. 1B is a corresponding diagram illustrating the testing of a transformer 1 using the apparatus which is described in greater detail below. The apparatus comprises a single unit 7 which incorporates a waveform generator, measuring system and a microprocessor. The apparatus 7 is connected to the transformer 1 under test by a single measurement channel 8 rather than by a plurality of separate channels as used in the prior art shown in FIG. 1A.

The apparatus 7 is capable of carrying out all the different tests carried out by the separate pieces of test equipment used in the prior art. This is achieved by providing the necessary functional components in an integrated arrangement which can be operated in the appropriate manner to carry out the different types of test.

The apparatus 7 will now be described in greater detail with reference to FIGS. 2(A) to 2(C).

Figure 2A:
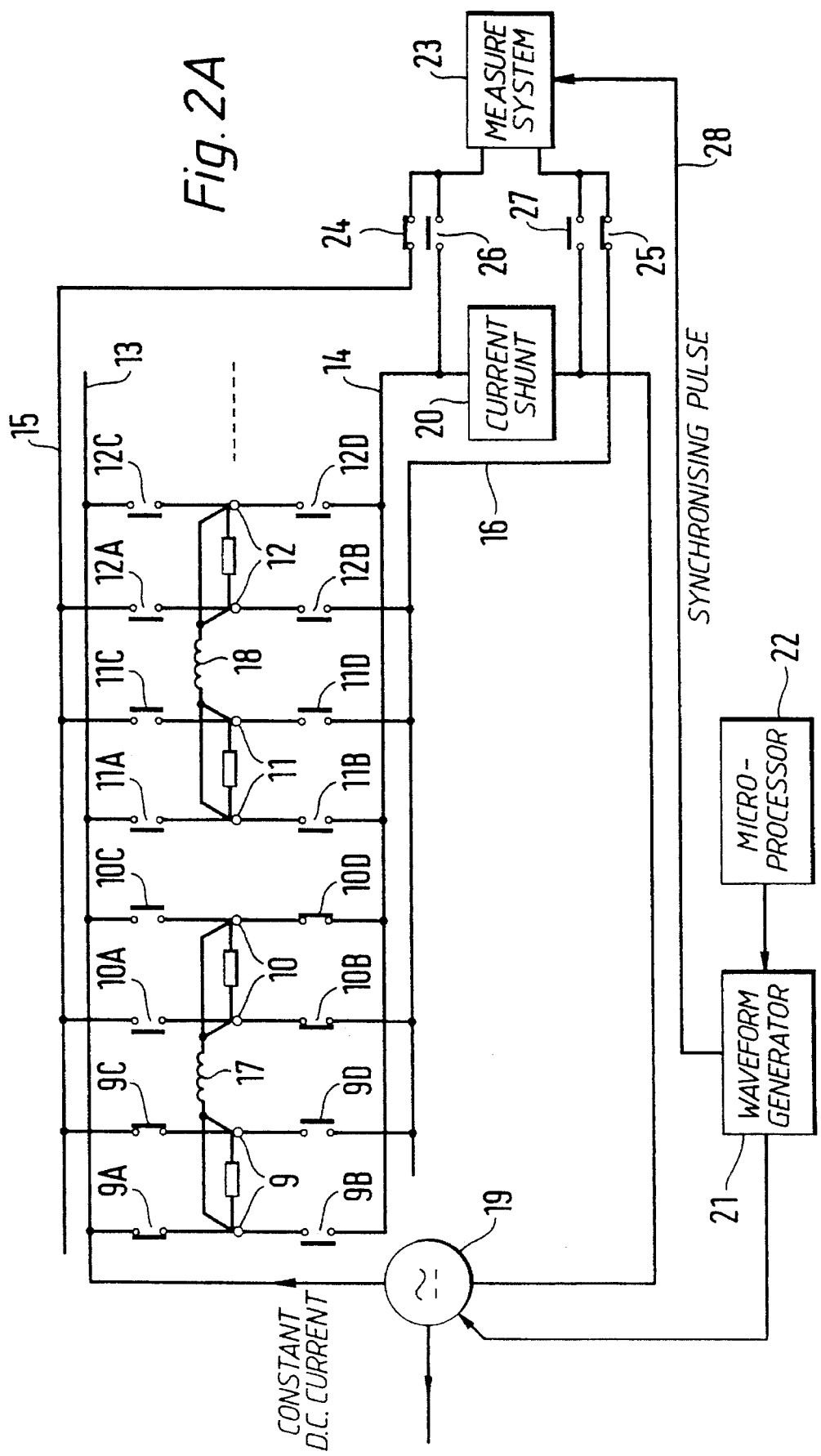

The apparatus shown in FIGS. 2(A) to 2(C) comprises a plurality of connection points 9, 10, 11, 12 and so on. Each connection point in fact comprises two elements which are electrically connected by an appropriate resistor, typically of around 100 ohms. One element of each connection point is connected to a first source bus 13 via a relay and to a second source bus 14 via another relay. Similarly, the other element of each connection point is connected to a first measuring bus 15 via a relay and to a second measuring bus 16 via another relay. A total of four relays are thus associated with each connection point as shown in FIG. 2(A). Connection point 9, for instance, can therefore be connected to the first source bus 13 by relay 9A, to the second source bus 14 by relay 9B, to the first measuring bus 15 by relay 9C and to the second measuring bus 16 by relay 9D.

In use, each of the coils of a wound component to be tested is connected between connection points as illustrated by a winding 17 connected between points 9 and 10 and by a winding 18 connected between points 11 and 12. By opening and closing the appropriate relays, the coils can be connected between the first and second source buses 13 and 14 and/or between the first and second measurement buses 15 and 16 as required by a particular test.

The first source bus 13 is connected to one side of a programmable voltage source 19 and the second source bus 14 is connected to the other side of the voltage source 19 via a current shunt 20. The voltage source is connected to an electronic waveform generator 21 which in turn is controlled by a microprocessor 22.

A measuring system 23, which comprises analog to digital converters for digitising the signals it receives, can be connected to the first and second measurement buses 15 and 16 by relays 24 and 25 and can also be connected across the shunt 20 by relays 26 and 27. A connection 28 is also provided between the measuring system 23 and the waveform generator 21 for carrying a synchronising signal (for reasons to be described below).

By opening and shutting the appropriate relays, tests signals can be applied by the voltage source 19 to a selected coil and measurements can be made of output signals appearing on the measurement buses 15 and 16 and/or across the current shunt 20 under the control of the microprocessor. Once the various windings of a component such as a transformer have been connected to the appropriate connection points, the apparatus automatically applies a series of different voltages and waveforms to the windings and measures the appropriate outputs so as to perform the required tests.

Figure 3:
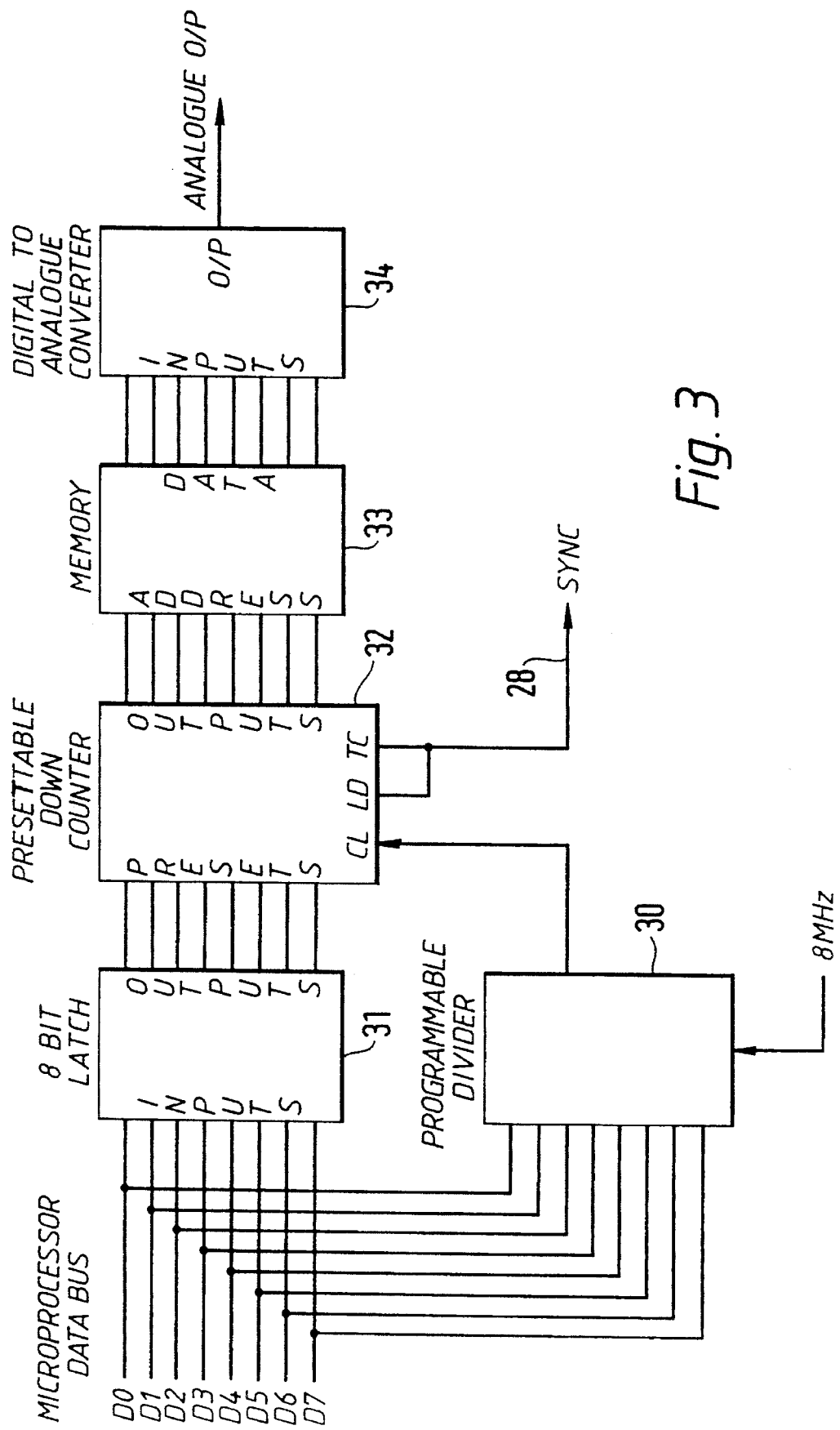
FIG. 3 illustrates a preferred form of waveform generator used in the apparatus shown in FIG. 2.

FIG. 3 illustrates a preferred form of the waveform generator 21. This comprises a programmable divider 30, an 8-bit latch 31 connected to the programmable divider 30 and the data bus of the microprocessor 22, a pre-settable down counter 32 connected to the 8-bit latch 31, a memory 33 connected to the down counter 32 and a digital to analogue converter 34 connected to the memory 33. The down counter 32 is also arranged to provide a clock signal to the programmable divider which is also provided with an input from an oscillator, e.g. an 8 MHz signal. The TC output of the down counter 32 is also connected to the load input thereof and provides a synchronising signal on a line 28 the purpose of which will be described further below.

The waveform generator is arranged to provide a selected waveform by loading the memory 33 with data representing the form of the desired wave and using the output of the down counter 32 as the address of the memory 33 to provide the appropriate output for each cycle of the waveform. A simple example of its operation can be shown by considering the generation of a size wave with a frequency of 16 KHz. First, the programmable divider is set to divide by 2 so as to produce a 4 MHz signal. The number of 4 MHz clock pulses for each cycle of a 16 KHz signal is thus calculated, i.e. $(4 \times 10^6) / (16 \times 10^3) = 250$ and the latch 31 is set to provide an 8-bit representation of 249 (i.e. 250–1). The first 250 memory locations in memory 33 are then loaded with data representing the form of the sine wave.

It will thus be seen that as the counter 32 counts down from 249 to 0 and each count is used to address the memory 33, the output of the memory 33 is a digital representation of the desired sine wave. The digital to analogue converter then converts this to an analogue wave form and its output is provided to the voltage source 19.

When the down counter 32 reaches 0, its output TC will go high and generate a synchronisation pulse on line 28. As the TC output is connected to the load input, this also causes the counter 32 to be reset to 249 so the next cycle of the wave form is generated.

Figure 4A:
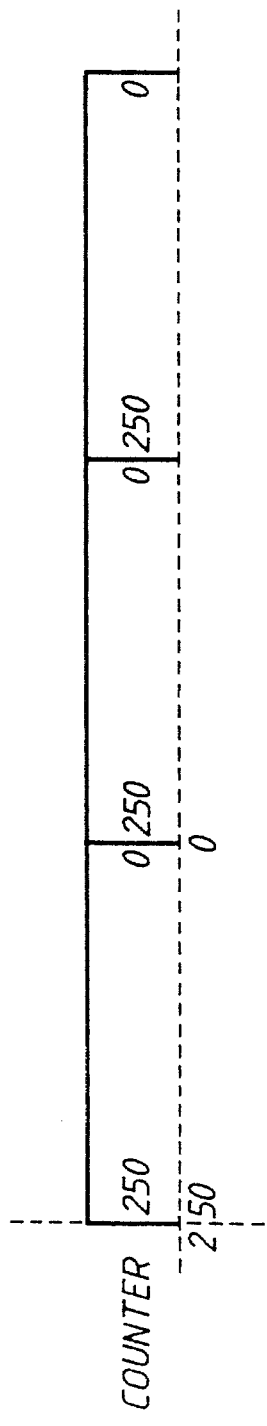
FIGS. 4(A), 4(B) and 4(C) illustrate various outputs of the waveform generator shown in FIG. 3 during its operation.
Figure 4B:
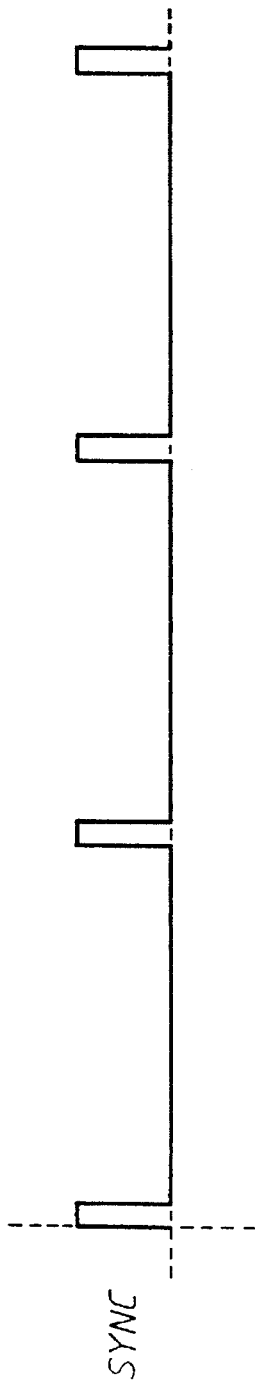
Figure 4C:
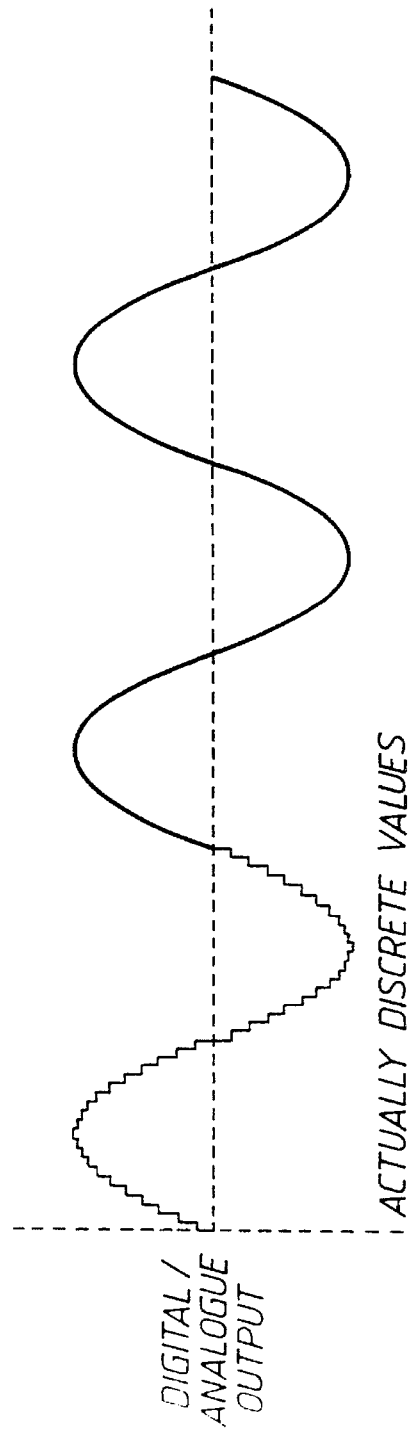

FIGS. 4(A), 4(B) and 4(C) illustrate the output of the down counter 32 provided to the memory 33, the TC output of the down counter 32 and the output of the memory 33 and of the D/A convertor 34, respectively, during the above operation.

It will be appreciated that such a waveform generator can be arranged to provide a wide range of different analogue wave forms by programming the memory 33, the down counter 32 and divider 30 as appropriate.

Figure 5:
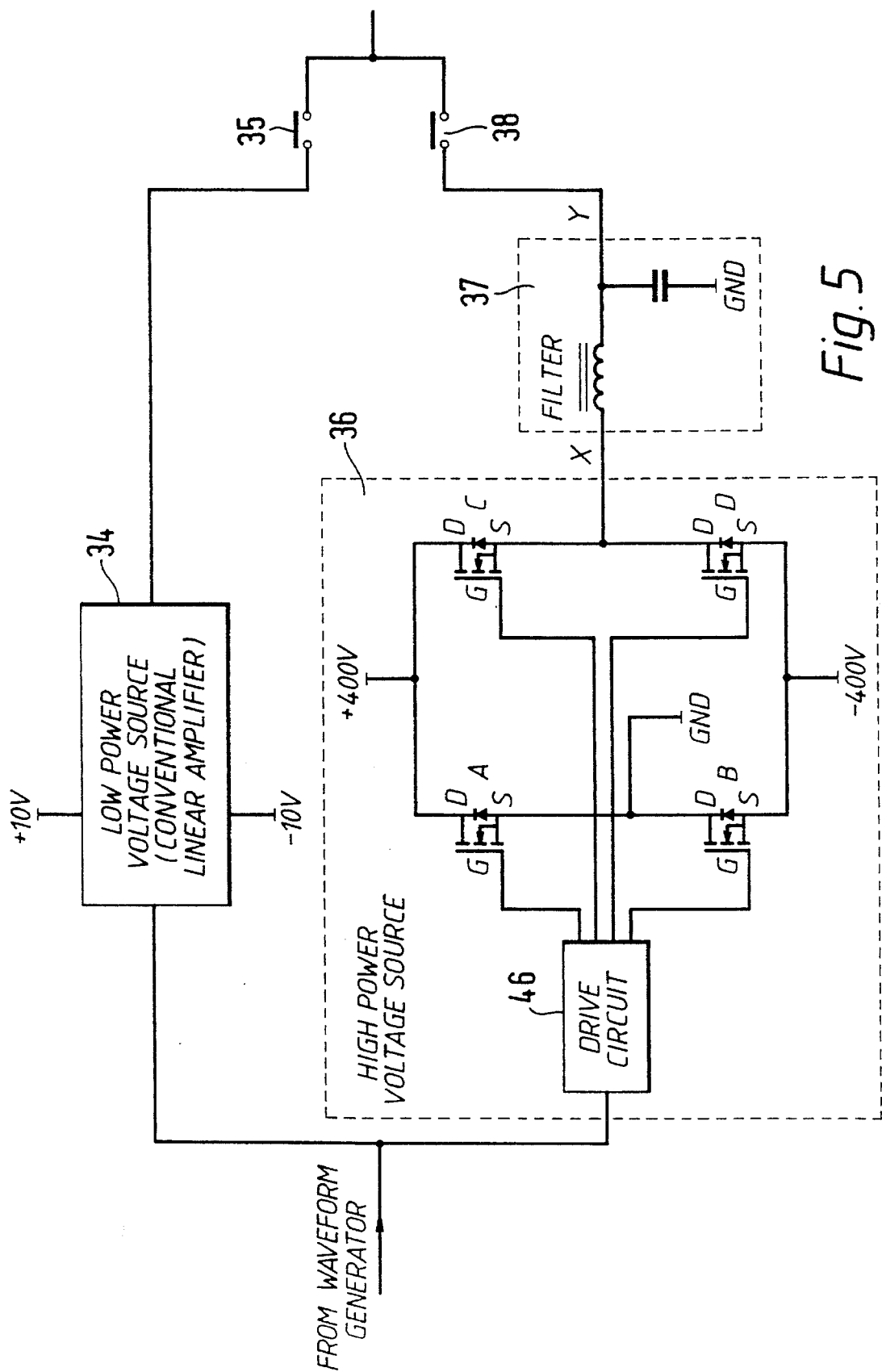
FIG. 5 illustrates a preferred form of a voltage source used in the apparatus shown in FIG. 2.

FIG. 5 illustrates a preferred form of the voltage source 19. This comprises a low power voltage source 34, e.g. a conventional linear amplifier, connected to the source bus via a relay 35 and a high power voltage source 36 connected to the Source bus via a low pass LC filter 37 and a relay 38.

The low power voltage source 34 is used for low power measurements, e.g. measurement of resistance, inductance, turns ratio etc, whereas the high power voltage source 36 is used for high power measurements, e.g. measurement of magnetising current, high tension insulation tests etc.

Figure 6:
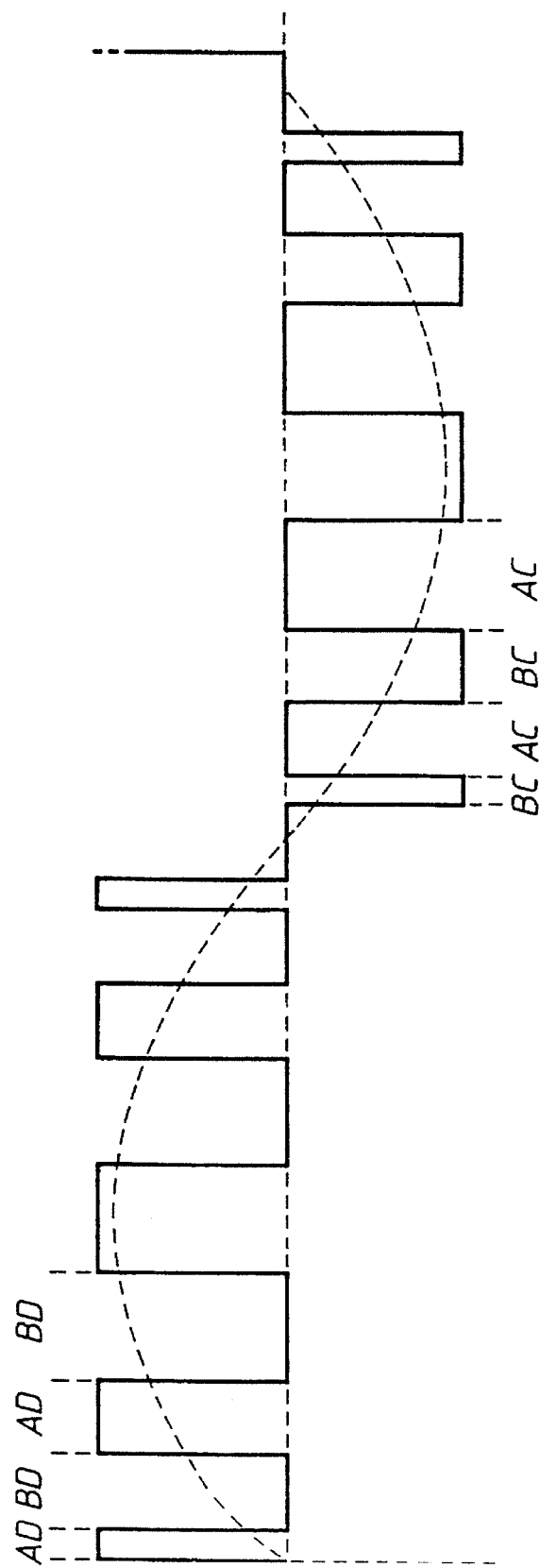
FIG. 6 is a diagram illustrating operation of part of the voltage source shown in FIG. 5.

The high power voltage source 36 comprises four transistors (FETs) A, B, C and D with antiparallel diodes. If these transistors were operated in the linear mode with voltages between ±400 v and a high current, there would be very high losses leading to the generation of a great deal of heat. However, if the transistors are operated as switches, the losses are very low. The transistors are therefore operated in a pulse width modulation technique, so they are switched between fully on and fully off states, to produce a stepped waveformed as illustrated in FIG. 6. Transistors A and D are switched on for varying periods of time as illustrated and then transistors B and C are switched on for corresponding periods of time. The output from the transistors is then applied to the low pass LC filter 37 to produce a sinusoidal output as shown by the dashed line in FIG. 6. A high power output is thus produced with very low losses.

The output of the waveform generator 21 is provided as an input to the low power voltage source 34 and is connected, via a conventional drive circuit 46, to the base input of each of the four FET transistors A, B, C and D.

Figure 7:
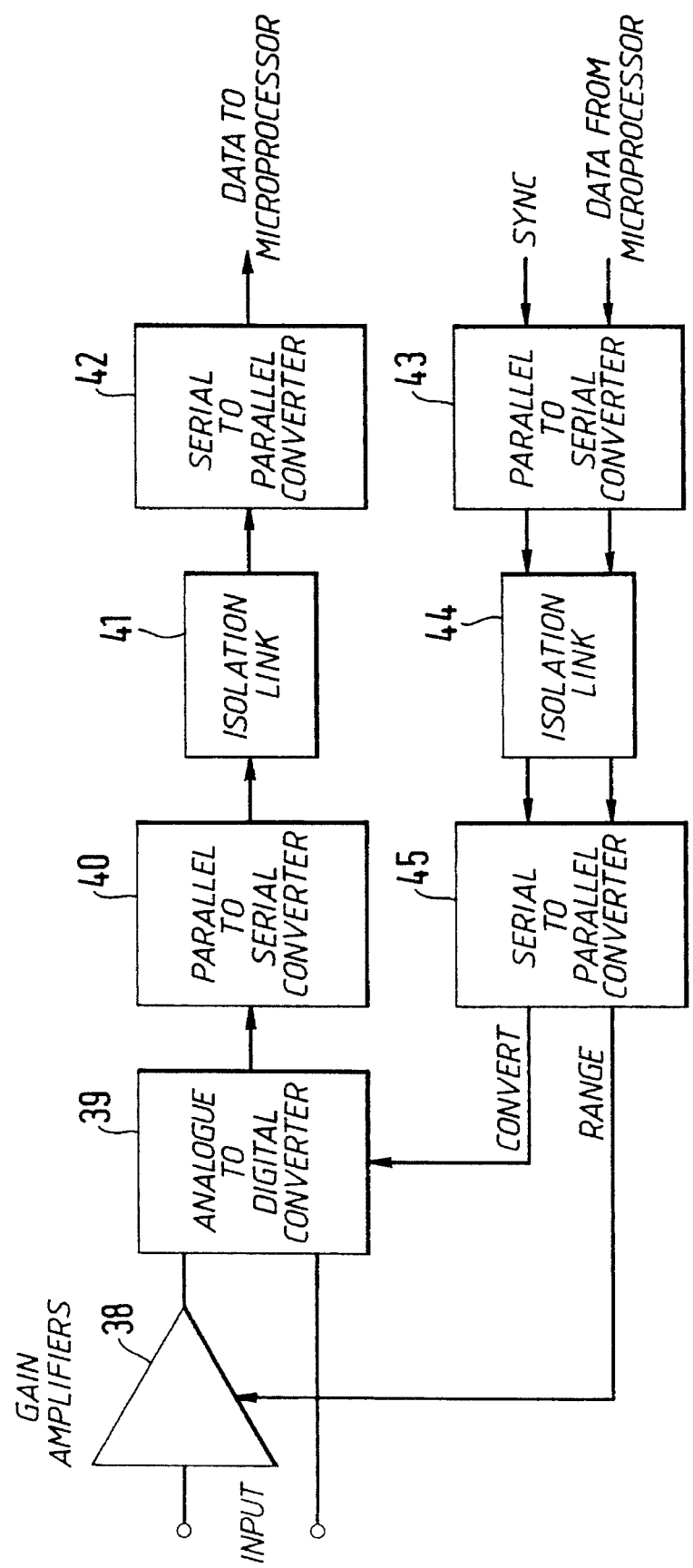
FIG. 7 illustrates a preferred form of a measuring system used in the apparatus shown in FIG. 2.

FIG. 7 illustrates a preferred form of the measuring system 23. The measured signal is input through gain amplifiers 38, an analogue to digital converter 39, a first parallel to serial converter 40, a first isolation link 41 and a first serial to parallel converter 42 before being passed to the microprocessor 22. The synchronisation signal received on line 28 is received through a second parallel to serial converter 43, a second isolation link 44 and a second serial to parallel converter 45 and connected to both the gain amplifiers 38 and the analogue to digital converter 39.

The parallel-serial-parallel converters isolate the analogue input received by the measuring system 23 from the microprocessor 22 and so allow accurate measurements across any pair of the connectors 9, 10, 11, 12 . . . to be carried out.

The microprocessor 22 is used to set the gain of the gain amplifiers 38 and the analogue to digital converter 39 converts the analogue signal received to digital data with the timing of the conversion being synchronised to the generation of waveforms by the waveform generator 21 by means of the synchronisation pulse received on line 28.

The measuring system 23 thus provides digital data representing analogue voltages and analogue currents from which all the required measurements can be made.

To illustrate operation of the apparatus described above, the manner in which the resistance of a winding can be tested will be described in relation to FIG. 2(A) and the manner in which the inductance can be tested will be described in relation to FIGS. 2(B) and 2(C).

To measure the resistance of a winding 17 connected between connection points 9 and 10, for instance, the relays 9A and 10B are closed to connect the coil to the source buses 13 and 14 and the voltage source 19 applies a constant DC current through the winding 17 and shunt 20. The relays 9C, 10D, 24 and 25 are also closed so the measuring system 23 can measure the voltage developed across the winding 17. The resistance of the winding 17 can thus be calculated using Ohm's Law and the results compared to the expected value held in memory of the microprocessor 22. Conventional apparatus uses an analog computation to process the measurements of voltage and current but as the measuring system digitises the signals, numerical techniques can be used to carry out the appropriate computations.

FIGS. 2(B) and 2(C) illustrate how the apparatus is used to measure the inductance of the winding 17. The conventional method of measuring the inductance of a winding involves the simultaneous measurement of voltage and current and so requires the use of two measurement channels so the phase shift between the two measurements can be determined. With the present apparatus, however, only a single measurement channel is required. This is achieved by making sequential measurements of the voltage and current and determining the phase relation between these measurements and a synchronisation signal. The phase relationship can then be deduced from this information. The principle of this technique is illustrated by FIGS. 8(A) to 8(D).

Figure 8A:
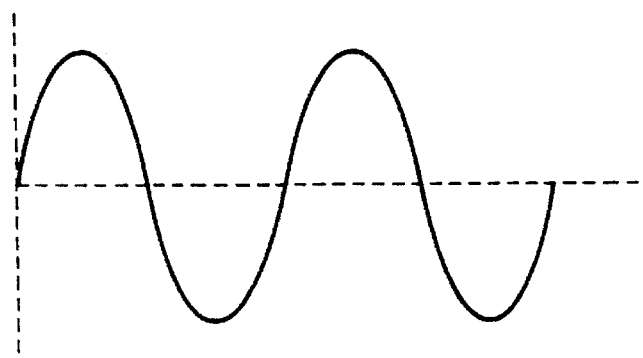
FIGS. 8(A)–8(D) are diagrams illustrating a method used in a preferred form of apparatus according to the invention for determining the phase relationship between measured signals.
Figure 8B:
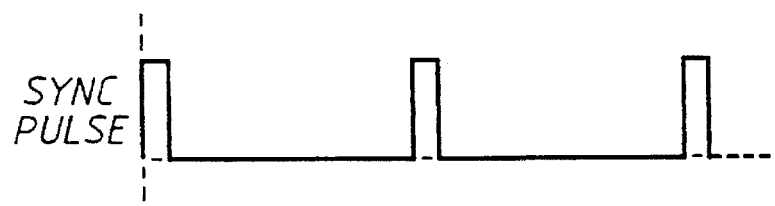
Figure 8C:
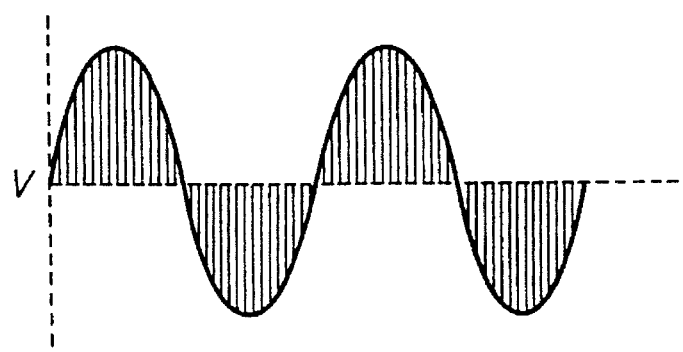
Figure 8D:
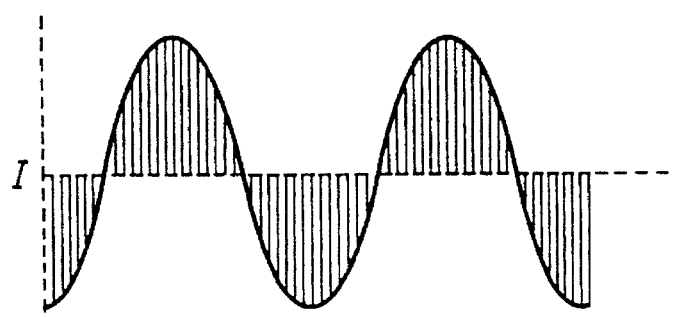

FIG. 8(A) shows a typical output waveform that might be applied to the winding 17 by the voltage source 19 and FIG. 8(B) shows the synchronisation pulses produced by the waveform generator 21 which are passed to the measuring system 23 via connection 28. FIGS. 8(C) and 8(D) illustrate the waveforms of the two parameters which are being measured, in this case voltage V and current I, and the vertical lines illustrate the manner in which these waveforms are digitised by the measuring system 23. The measuring system 23 is thus able to determine the phase relationship between the signals V and I and the synchronisation pulses. The voltage waveform V may, for instance, be found to have a phase relation of −33.7 degrees with the synchronisation pulses and the current waveform I a phase relation of −43.8 degrees with the synchronisation pulses. The phase relation of the current waveform I to the voltage waveform V can thus be deduced as being −10.1 degrees.

The relative magnitude and phase relation of two or more signals can thus be determined by reference to a synchronisation signal thus allowing measurements to be made using a single measurement channel rather than separate channel for each measurement.

FIG. 2(B) shows the manner in which the components of the apparatus are connected to measure the voltage applied across the winding 17. The relays 9A, 9C, 10B, 10D, 24 and 25 are closed to connect the voltage source 19 across the source buses 13 and 14 (via the shunt 20) and hence across the winding 17 and to connect the winding 17 to the measuring buses 15 and 16 and so to the measuring system 23. The voltage source 19 applies an AC waveform to the winding 17 and the measuring system 23 measures the voltage appearing across the winding 17 (this being the conventional four wire or kelvin method of measuring voltage across a winding). The measuring system 23 also determines the phase relationship between the measured voltage signal V and the synchronisation pulses received from the waveform generator 21.

Having measured the voltage waveform V in this manner, the connections are altered (automatically under the control of the microprocessor 22) so that relays 9A, 10B, 26 and 27 are closed as shown in FIG. 2(C). The voltage source 19 continues applying the same AC waveform to the winding 17 as in FIG. 2 (B) but the measuring system is now connected to measure the current flowing through the shunt 20 (and hence the current flowing through the winding 17). The measuring system also determines the phase relationship between the measured current waveform I and the synchronisation pulses received from the waveform generator 21. The measuring system 23 can thus calculate the phase relationship between the voltage waveform V and the current waveform I and hence calculate the inductive of the winding 17 taking into account those components of the signals which are in phase with each other and those which are not. This is again compared with the expected value held in memory by the microprocessor 22.

As the voltage waveform V and the current waveform I are digitised by the measuring system 23, the inductance can be determined using numerical techniques rather than by the conventional analog techniques.

For instance, Fourier analysis of the digital data representing the voltage across the inductor allows calculation of the inphase and quadrature components of the voltage. Similarly, Fourier analysis of the digital data representing the current through the inductor allows calculation of the inphase and quadrature components of the current. These can be converted to polar quantities and as the phase relationship between the signals is known, the inductance impedance can be calculated and then, knowing the frequency of the signal produced by the waveform generator 21, the inductance can be determined.

Other measurements which conventionally require the use of two measurement channels can be carried out in a similar manner, for instance measurement of the turns ratio of a transformer. This requires the measurement of the voltage applied to one winding and that produced on another winding and the phase relationship between the two. The two measurements can again be carried out at separate times and their phase relationship deduced by reference to the synchronisation pulses as described above. The true turns ratio can then be calculated by compensating for the voltage drop in the winding resistance caused by the magnetizing current and so provide a more accurate measurement than provided by a conventional nulling system.

It will be appreciated that the relays of the apparatus can be closed in a wide variety of arrangements and so enable different forms of connection to be made to each of the windings connected to the connection points 9, 10, 11, 12, . . . for carrying out the full range of tests required to test a transformer or other wound component fully.

Normally, the apparatus would be arranged to test the following parameters (or whatever combination of these is required to test fully a particular component).

1. Winding resistance.
2. Inductance.
3. Turns ratio and phasing.
4. Leakage inductance.
5. Interwinding capacitance.
6. Insulation resistance (e.g. at voltages up to 850 v dc).
7. Magnetising current.
8. Intergrity of interturn insulation.
9. Open circuit power loss.
10. Insulation when subject to high potentials (e.g. up to 5 kv AC).

Some of these tests require the provision of a high power AC test source (greater than, say, 800 volt-Amperes), e.g. a 60 Hz, 2 amps, 415 volts signal. As mentioned above, such a high power signal is conventionally provided using linear amplifiers which convert a DC signal to an AC signal of the appropriate frequency, power and voltage. However, linear amplifiers have a very low efficiency, e.g. in the order of 30%, so requiring the provision of large heat sinks, fans etc, to dissipate the heat they generate and are therefore very bulky. Such an arrangement is incompatible with the desire to provide a compact, integrated test apparatus. The apparatus described herein thus makes use of a pulse width modulation technique as described above. This technique can be used to generate relatively high power AC signals and as it uses transistors in a switching mode involves much lower power losses. This technique also has the advantage of allowing other types of waveform to be generated, e.g. high power square waves, rather than just the conventional sinusoidal waves.

By digitising the measured signals and using microprocessor techniques, the measuring system 23 is able to employ Fourier analysis algorithms which enable high order harmonics to be eliminated so allowing relatively inexpensive hardware to provide highly accurate measurements which could normally only be achieved using much more expensive (analog) equipment.

In its preferred form, the apparatus described herein can be provided in a relatively small cabinet, e.g. about 50 cm square and 20 cm deep. It will therefore be appreciated that it is considerably smaller and lighter than known testing arrangements. The cabinet may also be provided with a full alphanumeric keyboard for entering details of the component to be tested or for revising details of a test program, a vacuum flourescent VDU for displaying pass/fail indications and other information and a built in printer for providing a print-out of the test results. The cabinet may also be provided with a lid which automatically isolates exposed electrical terminals when open and when closed prevents the operator coming into contact with live connections.

Transformers are conventionally tested by mounting them on a suitable test jig. The cabinet described above is thus preferably provided with a test bed on which the jig can be seated and having electrical connectors for making the appropriate connections between the test bed and the connection points 9, 10, 11, 12 . . . of the test circuitry. By providing a matrix of connections across the test bed onto which the jig can be placed, the need to provide a multi-way plug and socket (sometimes requiring up to 60 connections) to connect the test jig to the apparatus can be avoided. This also means that high voltage signals can be applied between adjacent connecting points without the problems usually associated with providing such signals through a plug and socket in which the respective terminals may be positioned very close to each other.

The apparatus can be pre-programmed to test over a 100 (and optionally up to 1000) different types of wound component by providing the microprocessor with the necessary test data in solid state memory.

New test data can be easily programmed in using the keyboard provided so the user does not need to obtain any additional software to modify or update the function of the apparatus.

As it is a compact, self-contained unit, the apparatus can be simply installed by connecting to a mains power supply, connecting the component to be tested and entering details of the component to be tested on the keyboard. No time-consuming, complex installation or configuration procedures are required.

The apparatus is also capable of carrying out a thorough test of a wound component very quickly, e.g. a full series of tests can be performed in around 5 seconds which is a signficiant improvement over prior art apparatus in which the testing procedure may take 30 seconds or more.

The use of digital signals also allows a wide range of test and analysis techniques to be applied to the measured signals. For instance, it is also possible to connect up to eight sets of apparatus to a single computer for centralised programming, statistical analysis of the test results and quality control.

It will thus be appreciated that there are many advantages in providing apparatus which comprises the relevant functional components arranged so that they can be connected together and controlled in such a manner as to provide the same tests as previously provided by separate pieces of test equipment. Duplication of components can be avoided, e.g. it is only necessary to provide one power source, one microprocessor, one measuring system etc. so making the apparatus much less expensive and much more compact. In addition, this arrangement enables the apparatus to provide more accurate measurements, e.g. because of shorter lead lengths, and makes it much more adaptable than prior art arrangements.

The use of a synchronising signal enables tests to be carried out using only a single measurement channel and digitisation of these signals enables a wider range of tests to be carried out, e.g. by applying a series of stepped test signals rather than just a single signal, and for the measured signals to be more accurately determined as well as allowing for the influence of one signal on another to be taken account of.

The apparatus can be used for testing a wide variety of wound components, including line frequency transformers, switched mode transformers, dc-dc converter and pulse transformers, telecom and audio transformers, inductors, chokes etc.

INDUSTRIAL APPLICABILITY

The apparatus described above can be manufactured and used in a wide range of industries for testing wound components.

I claim:

1. An apparatus for testing a wound component, comprising: a plurality of connection points for connecting the testing apparatus to the component to be tested; signal generating means; a first set of switches for selectively connecting the signal generating means to one or more of the connection points to enable the signal generating means to apply a variety of different test signals to the component to be tested; measuring means; a second set of switches for selectively connecting the measuring means to one or more of the connection points to enable the measuring means to measure a variety of different outputs from the component to be tested; and control means for controlling the first and second set of switches so as to control which of the connection points are connected to the signal generating means and which of the connection points are connected to the measuring means, for controlling the signals applied by the signal generating means to the selected connection points, and for controlling operation of the measuring means to enable the signal generating means and the measuring means to be operated so as to carry out a variety of different forms of tests on the component to be tested, wherein the signal generating means is connected to the measuring means and is arranged to provide a synchronising signal thereto, and wherein the measuring means is arranged to calculate the phase relationship between signals measured at different times by comparing the phase relationships of those signals with the synchronising signal.

2. An apparatus as claimed in claim 1 comprising a pair of source buses connected to the signal generating means and arranged such that each of the source buses can be selectively connected to each of the connection points by said first set of switches.

3. An apparatus as claimed in claim 2 in which one of the source buses is connected to the signal generating means via a current shunt.

4. An apparatus as claimed in claim 2 comprising a pair of measurement buses connectable to the measuring means and arranged so that each of the measurement buses can be selectively connected to each of the connection points by said second set of switches.

5. An apparatus as claimed in claim 4 in which one of the source buses is connected to the signal generating means via a current shunt and in which the measuring means is selectively connectable to the measuring buses and across the current shunt by means of further switches.

6. An apparatus as claimed in claim 1 in which the signal generating means comprises a programmable waveform generator.

7. An apparatus as claimed in claim 1 in which the signal generating means can be arranged to provide a relatively high power signal, e.g. greater than 800 Volt-Amperes, using a pulse width modulation technique.

8. An apparatus as claimed in claim 1 in which the measuring means comprises analog to digital converters for digitising the measured signals.

9. An apparatus as claimed in claim 8 in which the measuring means is arranged to carry out numerical analysis of the digitised signals using software algorithms.

10. An apparatus as claimed in claim 1 in which the control means comprises a microprocessor.

11. An apparatus as claimed in claim 10 in which the apparatus is provided with a keyboard for providing instructions and/or data to the microprocessor and display means for displaying the results of a test.

12. An apparatus as claimed in claim 1 comprising a printer for providing a print-out of test results.

13. An apparatus as claimed in claim 1 which is self-contained and requires only to be connected to a power source to operate.

14. An apparatus as claimed in claim 13 which is contained within a compact, portable housing, e.g. having a maximum dimension of around 50 cm.

\* \* \* \* \*